United States Patent
Andersson et al.

(10) Patent No.: US 9,209,937 B2
(45) Date of Patent: Dec. 8, 2015

(54) RELIABLE DECODING OF A HIGH-SPEED SHARED CONTROL CHANNEL

(75) Inventors: Lennart Andersson, Hjärnarp (SE); Andres Reial, Malmö (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 1156 days.

(21) Appl. No.: 11/944,773

(22) Filed: Nov. 26, 2007

(65) Prior Publication Data

US 2009/0003377 A1    Jan. 1, 2009

Related U.S. Application Data

(60) Provisional application No. 60/946,937, filed on Jun. 28, 2007.

(51) Int. Cl.
| | |
|---|---|
| *H04L 1/00* | (2006.01) |
| *H04L 1/20* | (2006.01) |
| *H03M 13/37* | (2006.01) |
| *H03M 13/41* | (2006.01) |
| *H03M 13/00* | (2006.01) |
| *H04L 1/18* | (2006.01) |

(52) U.S. Cl.
CPC ......... *H04L 1/0072* (2013.01); *H03M 13/3738* (2013.01); *H03M 13/3776* (2013.01); *H03M 13/41* (2013.01); *H03M 13/653* (2013.01); *H04L 1/0054* (2013.01); *H04L 1/20* (2013.01); *H04L 1/208* (2013.01); *H04L 1/1812* (2013.01)

(58) Field of Classification Search
CPC . H04L 1/0054; H04L 1/208; H04M 13/3776; H04M 13/41
See application file for complete search history.

(56) References Cited

U.S. PATENT DOCUMENTS

| 4,087,787 A | * | 5/1978 | Acampora | ................... 714/795 |
| 4,675,871 A | | 6/1987 | Gordon et al. | |
| 5,157,672 A | | 10/1992 | Kondou et al. | |

(Continued)

FOREIGN PATENT DOCUMENTS

| EP | 1355430 A1 | 10/2003 |
| EP | 1605597 A1 | 12/2005 |

(Continued)

OTHER PUBLICATIONS

Texas Instruments, "HS-SCCH: Performance Results and Improved Structure." 3GPP TSG RAN WG1 Meeting #25, R1-02-0535, Paris, France, Apr. 9-12, 2002. XP-002314992.

(Continued)

*Primary Examiner* — Xavier S. Wong
(74) *Attorney, Agent, or Firm* — Coats & Bennett, PLLC (57) ABSTRACT

Methods and apparatus are disclosed for detecting a control channel message transmitted on one of a plurality of shared control channels and targeted to a wireless receiver. In an exemplary method, messages transmitted over a plurality of shared control channels are decoded, and at least one likelihood metric is determined for each of the decoded messages. A best candidate is selected from the decoded messages, based on the likelihood metrics, and the at least one likelihood metric for the best candidate is compared to corresponding likelihood metrics for the messages other than the best candidate to determine whether the best candidate is a valid message. Wireless communication receivers configured correspondingly are also disclosed.

18 Claims, 3 Drawing Sheets

(56) References Cited

U.S. PATENT DOCUMENTS

| | | | | |
|---|---|---|---|---|
| 6,192,502 | B1 * | 2/2001 | Yamaguchi et al. | 714/795 |
| 6,526,104 | B1 * | 2/2003 | Hutchins et al. | 375/341 |
| 6,982,942 | B2 * | 1/2006 | Uchida et al. | 369/59.22 |
| 7,054,288 | B2 | 5/2006 | Sternberg et al. | |
| 7,055,089 | B2 * | 5/2006 | Miyauchi et al. | 714/794 |
| 7,392,459 | B2 * | 6/2008 | Bernadac et al. | 714/780 |
| 7,609,777 | B2 * | 10/2009 | Garrett | 375/341 |
| 7,634,714 | B2 * | 12/2009 | Lin | 714/795 |
| 7,764,741 | B2 * | 7/2010 | Moorti et al. | 375/256 |
| 2003/0026359 | A1 * | 2/2003 | Loeliger et al. | 375/341 |
| 2003/0189918 | A1 | 10/2003 | Das et al. | |
| 2003/0192003 | A1 | 10/2003 | Das et al. | |
| 2004/0001428 | A1 | 1/2004 | Datta et al. | |
| 2004/0077368 | A1 | 4/2004 | Anderson | |
| 2004/0264555 | A1 * | 12/2004 | Hegde et al. | 375/148 |
| 2005/0066260 | A1 * | 3/2005 | Natori | 714/795 |
| 2005/0078648 | A1 | 4/2005 | Nilsson | |
| 2005/0094615 | A1 | 5/2005 | Kim et al. | |
| 2005/0100038 | A1 | 5/2005 | Pietraski et al. | |
| 2005/0169399 | A1 * | 8/2005 | Magee et al. | 375/267 |
| 2005/0180344 | A1 | 8/2005 | Sternberg et al. | |
| 2005/0286654 | A1 * | 12/2005 | Tanrikulu et al. | 375/316 |
| 2006/0203780 | A1 | 9/2006 | Terry | |
| 2006/0205357 | A1 * | 9/2006 | Kim | 455/69 |
| 2006/0215705 | A1 | 9/2006 | Murata et al. | |
| 2006/0252379 | A1 | 11/2006 | Michel et al. | |
| 2007/0036104 | A1 | 2/2007 | Bachl et al. | |
| 2008/0247493 | A1 * | 10/2008 | Gutcher et al. | 375/341 |

FOREIGN PATENT DOCUMENTS

| | | | | |
|---|---|---|---|---|
| WO | | 2005/032194 A1 | 4/2005 | |
| WO | | 2007/148100 A1 | 12/2007 | |
| WO | WO | 2009/000697 A3 * | 2/2009 | H04L 1/00 |

OTHER PUBLICATIONS

Reial, A. et al. "HS-PDSCH Blind Decoding." U.S. Appl. No. 11/952,002, filed Dec. 6, 2007.

Ratasuk, Rapeepat et al. "Power Control of the High Speed Shared Control Channel." 2005 IEEE 62nd Vehicular Technology Conference (VTC-2005-Fall), vol. 4, Sep. 25-28, 2005, pp. 2449-2453.

Ghosh, Amitava et al. "Control Channel Design for High Speed Downlink Shared Channel for 3GPP W-CDMA, Rel-5." 2003 IEEE 57th Semiannual Vehicular Technology Conference (VTC-2003-Spring), vol. 3, Apr. 22-25, 2003, pp. 2085-2089.

Wellig, Armin et al. "Novel Optimum Reduced Search MLSE Decoding Algorithm Enabling System-Aware Power Savings." 2004 IEEE Radio and Wireless Conference, Sep. 19-22, 2004, pp. 27-30.

Ge, Yiqun et al. "Design Space Exploration of HSDPA Subsystem Algorithms and Architectures." 2004 IEEE 59th Vehicular Technology Conference (VTC-2004-Spring), vol. 3, May 17-19, 2004, pp. 1246-1250.

Asghar, Ziad et al. "Automatic Threshold Control for Improved Paging Detection Performance in Wireless Systems." IEEE Global Telecommunications Conference 2004 (GLOBECOM '04), vol. 5, Nov. 29-Dec. 3, 2004, pp. 3310-3315.

Lomi, Valentina et al. "False Alarm Probability-Based Estimation of Multipath Channel Length." IEEE Transactions on Communications, vol. 51, Issue 9, Sep. 2003, pp. 1432-1434.

Prator, Oliver et al. "Impact of Channel Estimation on the 3GPP-TD-CDMA." IEEE Global Telecommunications Conference 2001 (BLOVECOM '01), vol. 6, Nov. 2001, pp. 3365-3369.

Werner, Stefan et al. "Combined Frequency and Time Domain Channel Estimation in Mobile MIMO-OFDM Systems." 2006 IEEE International Conference on Acoustics, Speech and Signal Processing (ICASSP 2006), vol. 4, May 14-19, 2006, pp. IV-373-IV-376.

3GPP TR 25.903 V7.0.0 (Mar. 2007). 3rd Generation Partnership Project; Technical Specification Group Radio Access Network; Continuous Connectivity for Packet Data Users (Release 7). Section 4.6, Restricted HS-SCCH, pp. 102-134.

* cited by examiner

RELIABLE DECODING OF A HIGH-SPEED SHARED CONTROL CHANNEL

CROSS REFERENCE TO RELATED APPLICATION

This application claims the benefit of U.S. Provisional Application No. 60/946,937, filed on Jun. 28, 2007, which is incorporated by reference as if fully set forth herein.

BACKGROUND

1. Technical Field

The present invention generally relates to wireless communication systems, and particularly relates to message detection, such as HS-SCCH Part 1 detection in a Wideband Code-Division Multiple Access system.

2. Background

High-speed downlink packet access (HSDPA) was introduced in Release 5 of the $3^{rd}$-Generation Partnership Project (3GPP) standards for $3^{rd}$-generation mobile phone systems to provide enhanced data transfer speeds to Wideband Code-Division Multiple Access (W-CDMA) mobile terminals. HSDPA is supported by a transport channel, called the High-Speed Downlink Shared Channel (HS-DSCH), a physical control channel, called the high-speed shared control channel (HS-SCCH), and a physical data channel, the high-speed physical downlink shared channel (HS-PDSCH). The HS-SCCH carries all of the signaling related to the HS-DSCH, while HS-DSCH user data is carried on the HS-PDSCH.

Recent revisions to the HSDPA specification, providing further enhancements in system capacity and mobile terminal efficiency, include the addition of support for advanced multi-antenna technology, i.e., Multiple-Input-Multiple-Output (MIMO) technology, as well as for so-called Continuous Packet Connectivity (CPC). These revisions each comprise extensions to the content and usage of signaling over the HS-SCCH.

CPC is introduced in W-CDMA Release 7. The original objective of the specification developers was to reduce the uplink noise rise caused by transmission of physical control channels for packet data users, to make it possible to keep more packet data users in a simultaneously connected state (the CELL_DCH state) for long time periods of time without reducing the cell throughput. Packet data users will thus experience significantly reduced delays, as time consuming reconnections are avoided, resulting in a user experience more similar to that currently experienced in fixed broadband data networks. However, the objectives of CPC have become broader, and now include a reduction of the downlink overhead as well as reduction of power consumption by packet data users' mobile terminals.

The new features of CPC are supported by a new cyclic redundancy check (CRC) computation method (Type 2 CRC) for the HS-DSCH and a new HS-SCCH message format (Type 2 HS-SCCH). Importantly, mobile terminals supporting Release 7 should also be capable of simultaneously handling the legacy (Release 6) HSDPA formats, referred to as Type 1.

One of the new features of the CPC revisions to the HSDPA specification is a so-called HS-SCCH-less operation. HS-SCCH-less operation is intended for low data rate applications such as voice-over-Internet-Protocol (VoIP) service. The general approach is to reduce transmission of the HS-SCCH, which normally generates a significant amount of overhead for small data packets, by eliminating the transmission of the HS-SCCH during initial transmissions of data. (Upon the failure of the mobile terminal to acknowledge successful receipt of an initial transmission of data, up to two Hybrid Automatic Repeat Request (HARQ) retransmissions may follow. Each of these retransmissions is "announced" using Type 2 HS-SCCH signaling). Because initial transmissions of new data are not signaled by the HS-SCCH in HS-SCCH-less operation, a mobile terminal must employ "blind" detection, using a limited set of coding parameters and transport block sizes, to detect these transmissions.

HS-SCCH-less operation is configured by the serving Radio Network Controller, or SRNC, on a per-user-equipment basis, by assigning four predetermined transport block sizes and two predetermined HS-PDSCH codes to a given user equipment (UE). The configured UE thus attempts to blindly decode all packets received on one or two HS-PDSCHs, subject to the limited choice of transport block size, using the new Type 2 CRC to detect successful decoding of an HS-SCCH-less transmission. At the same time, however, the UE should continue to monitor up to four HS-SCCHs for control messages directed to the UE. A Release 7 UE should detect both Type 1 and Type 2 HS-SCCH messages, and should also be able to determine whether a received HS-SCCH is of Type 1 or Type 2.

An HS-SCCH subframe (of any type) consists of two parts, transmitted over three slots. Part 1, which is mapped to the first of the three slots, is used by a UE to determine information describing an imminent HS-PDSCH transmission for the UE, including an identification of the channelization code(s) and modulation method to be used on the HS-PDSCH transmission. Part 1 messages targeted to a specific UE are distinguished from others through the use of an UE-specific scrambling sequence. Part 2, which is mapped to the second and third slots of the HS-SCCH subframe, provides information about transport block size as well as HARQ process information. Part 1 of the HS-SCCH subframe, which is transmitted slightly before the corresponding HS-PDSCH subframe, is designed to include enough information to enable the UE to begin reception of the corresponding HS-PDSCH subframe, as the transmission of Part 2 overlaps transmission of the HS-PDSCH subframe. The HS-SCCH is also used to give orders in exceptional cases—these orders are identified by a Part 1 message consisting of only zeros. For non-MIMO operation, Part 1 consists of 8 data bits coded to 40 bits (⅓ convolution code, rate matched to 40 bits) masked with a 16-bit UE identity coded to 40 bits (½ convolution code, rate matched to 40 bits).

MIMO is also introduced in Release 7. Like HS-SCCH-less operation, MIMO mode is configured per UE. Another new HS-SCCH format (Type M) is introduced to support MIMO. MIMO operation is a distinct mode; thus, a UE configured to be in MIMO mode should only detect and support HS-SCCH Type M and not Type 1 and Type 2. An HS-SCCH Type M subframe is split into two parts as before, but the number of bits and their meanings are different. In particular, Part 1 consists of 12 data bits instead of 8, although the 12 bits are coded to 40 bits for transmission, like Type 1 Part 1 messages.

A conventional HS-SCCH decoder might apply convolutional decoding, e.g., using a Viterbi decoder, to each part of the message. The decoded Part 1 message is used to configure receiver circuitry for demodulation and soft value extraction of the HS-PDSCH. Upon receiving Part 2, the CRC may be used to determine that the current message was for the given UE. Since up to four HS-SCCH codes (channels) are simultaneously monitored, a Part 1 message is decoded for each. Of course, only one of the messages may be targeted at the UE for any given subframe. Typically, the message corresponding to the "best" decoding result is used to set up for traffic data reception. A drawback to this method is that traffic data is always buffered and at least partially demodulated, regardless of whether there actually was a message for the given UE or not.

To save decoding resources and to allow HS-PDSCH reception to be shut down when there is no data for the given UE, various improved HS-SCCH detection methods have been proposed. In one approach, a received Part 1 coded bit sequence is not explicitly decoded, but is instead detected using a maximum-likelihood (ML) process. Given a Type 1 HS-SCCH, a 40-bit hypothesis sequence is computed for each of the 256 possible 8-bit Part 1 messages. Each of the 256 hypotheses is correlated with the received soft values on each of the up to four different HS-SCCH monitored. The hypothesis yielding the highest correlation value is selected, and reception of the corresponding HS-DSCH is begun if this correlation value is sufficiently large. In a variant of this approach, reception of the corresponding HS-DSCH is only initiated if the highest correlation value is sufficiently greater than the other (255) correlation results. For instance, the UE might require that the "winning" correlation result be at least $\tau$ times the average absolute correlation among the other candidates. The choice of $\tau$ is a trade-off between missed detections, which lead to reduced throughput due to re-transmissions, and false alarms, which increase UE power consumption due to unnecessary demodulation of the HS-PDSCH. The value of $\tau$ must of course be greater than one; a reasonable selection for the value of $\tau$ in some implementations might be 4.5.

With respect to Type 1 HS-SCCH signaling, the maximum-likelihood detection process described above is computationally more efficient than the conventional Viterbi decoding approach. It also yields a useful reliability measure for the preferred hypothesis, which may be used to decide whether Part 2 detection and traffic data demodulation is necessary. This in turn leads to reduced power consumption by the UE. However, the ML detection solution for Release 6 implementations (Type 1 HS-SCCH) needs to consider only 256 hypotheses (40 bits each) corresponding to the 8 bit data field in Part 1. Release 7 implementations that support HS-SCCH Type M would instead require 4096 hypotheses (40 bits each) corresponding to the 12 bit data field in Part 1. This makes ML detection of the HS-SCCH Part 1 message less attractive as an alternative to the convolutional decoding approach.

The maximum-likelihood detection solution for HS-SCCH Part 1 messages described above considers a trade-off between missed detections and false alarms. With the addition of Type 2 HS-SCCH signaling, false alarms will result in not only increased power consumption, as the UE attempts to decode non-existent Type 1 HS-DSCH, but will also reduce throughput in the event that a HS-SCCH-less transmission was actually scheduled for the HS-DSCH subframe corresponding to a HS-SCCH false alarm. To save power and avoid false alarms in detecting Type 1 Part 1 messages, a decoding approach is needed that facilitates the assessment of the likelihood that a decoded message actually corresponds to a message sent to the given UE, and allows false alarm and missed detection probabilities to be tuned to acceptable levels.

SUMMARY

One or more embodiments of the invention presented herein provide an HS-SCCH Part 1 detection approach that is computationally efficient for the 3GPP Release 7 HS-SCCH structure and that includes a mechanism for differentiating between successful and unsuccessful detection, so that suitable missed detection and false alarm criteria may be applied. One or more candidate messages are decoded for each of a plurality of received HS-SCCH channels and a likelihood metric for the best candidate is compared to the likelihood metrics of other candidates to determine whether the best candidate is a valid message.

In several embodiments, a hybrid method using a maximum-likelihood detection approach is used to assess the likelihood that the best candidate is a valid message. In some of these embodiments, correlation values for a subset of candidates consisting of the Viterbi decoder outputs as well as additional randomly-selected candidates are used. In other embodiments, the Viterbi decoder output quality measures for all HS-SCCH codes alone may be used to assess the likelihood that a Part 1 message was actually received.

In an exemplary general method, control channel messages transmitted over a plurality of shared control channels are decoded, and at least one likelihood metric is determined for each of the decoded messages. A best candidate is selected from the decoded messages, based on the likelihood metrics, and the at least one likelihood metric for the best candidate is compared to corresponding likelihood metrics for the messages other than the best candidate to determine whether the best candidate is a valid message.

In some embodiments, one or more additional candidate messages are generated, and additional likelihood metrics corresponding to the additional candidate messages are calculated. In these embodiments, the at least one likelihood metric for the best candidate is compared to the additional likelihood metrics and to corresponding likelihood metrics for the decoded messages other than the best candidate.

In some embodiments, the likelihood metrics used to determine whether a selected best candidate is a valid message are formed by re-encoding the decoded messages, as well as any additional candidate messages, and correlating the re-encoded bit sequences with a received sequence of soft bit values. In several of these embodiments, a best candidate is determined to be valid by testing whether the likelihood metric for the best candidate message (in these embodiments, the correlation value) exceeds a scaled average of the likelihood metrics for the other candidates, e.g. whether $$\frac{c_{i_{max}}}{\underset{i \neq i_{max}}{mean[|c_i|]}} \geq \tau,$$

where $c_{i_{max}}$ is the likelihood metric for the best candidate of all the candidate messages, where message i has correlation value $c_i$, and where $\tau$ is a scaling constant greater than one.

The above described methods, and variants thereof, may be implemented in a receiver that includes one or more appropriately configured processing circuits, which may comprise hardware, software, or any mix thereof. For example, a special or general-purpose microprocessor or digital signal processor may be configured to execute computer program instructions carrying out the above method of combined packet processing, or variations thereof.

By way of non-limiting examples, the teachings set forth herein, and variations of those teachings, may be applied to W-CDMA (Wideband Code-Division Multiple Access) networks offering HSDPA (High Speed Downlink Packet Access) services and/or HSUPA (High Speed Uplink Packet Access) services.

Of course, the present invention is not limited the above contexts, nor is it limited to the above features and advantages. Indeed, those skilled in the art will recognize additional features and advantages upon reading the following detailed description, and upon viewing the accompanying drawings.

DETAILED DESCRIPTION

Figure 1:
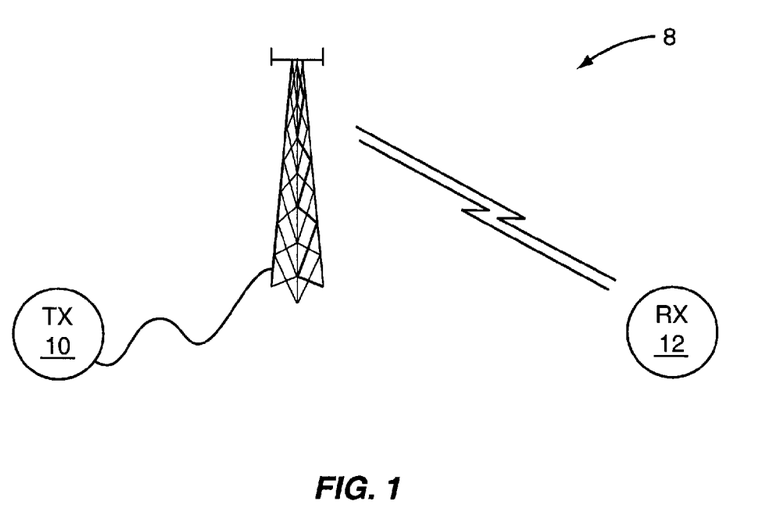
FIG. 1 is a block diagram partially illustrating a wireless communication network including an exemplary wireless communication receiver.

FIG. 1 partially illustrates a wireless communication network 8 including a transmitter 10 for transmitting packets of encoded information to a (remote) receiver 12, wherein receiver 12 is configured to detect and decode control channel messages associated with one or more the encoded information packets. According to one or more embodiments taught herein, receiver 12 decodes messages sent over a plurality of shared control channels, determining at least one likelihood metric for each of the decoded messages. After selecting a best candidate from the decoded messages, based on the likelihood metrics, receiver 12 compares a likelihood metric for the best candidate to the corresponding likelihood metrics for messages other than the best candidate to determine whether the best candidate is a valid message. Upon detection of a valid message, receiver 12 may configure receiver resources to decode packet data targeted to receiver 12 and transmitted on a shared traffic channel. This approach to detecting control channel messages may provide, among other things, improved power consumption by receiver 12 as well as improved data throughput from transmitter 10 to receiver 12.

By way of non-limiting example, wireless communication network 8 comprises a Wideband Code-Division Multiple Access (W-CDMA) network supporting High-Speed Downlink Packet Access (HSDPA) and/or High-Speed Uplink Packet Access (HSUPA) services. In such embodiments, transmitter 10 comprises a Node B radio transceiver and/or a supporting RNC (Radio Network Controller) and receiver 12 comprises a wireless communication device, such as a cellular radiotelephone, PDA (Portable Digital Assistant), pager, wireless communication card or module, etc. Thus, it should be understood that wireless communication network 8 appears in simplified form, and that transmitter 10 and receiver 12 each may operate as transmit/receive devices or systems, i.e., the terms "transmitter" and "receiver" here provide convenient reference terminology in the context of packet transmission, reception, and retransmission operations.

Figure 2:
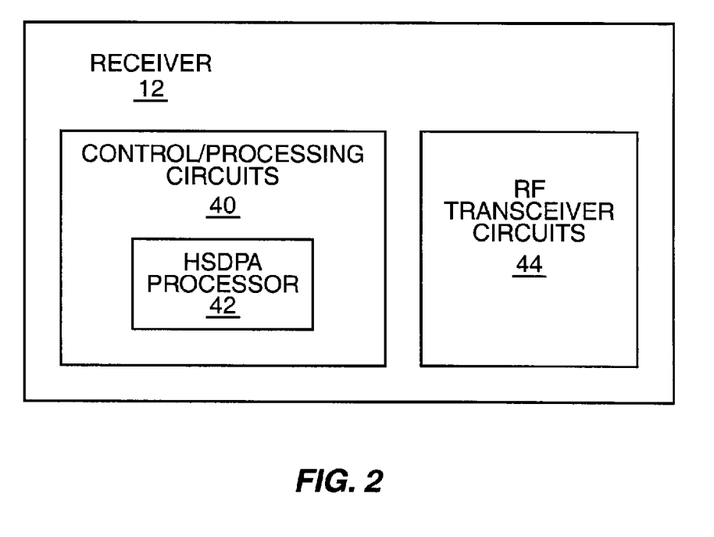
FIG. 2 is a block diagram of an exemplary wireless communication receiver.

FIG. 2 illustrates functional circuit details for one or more embodiments of receiver 12. Receiver 12 includes control/processing circuits 40, including an HSDPA processor 42, and RF transceiver circuits 44. Those skilled in the art will appreciate that various portions of the control/processing circuits 40, including the HSDPA processor 42, may be implemented in hardware, software, or any combination thereof. For example, in at least one embodiment, control/processing circuits 40 include one or more special or general-purpose microprocessors, digital signal processors, and/or other digital processing elements, which are configured, among other things, to execute computer program instructions implementing control channel processing according to any of the embodiments taught herein.

Figure 3:
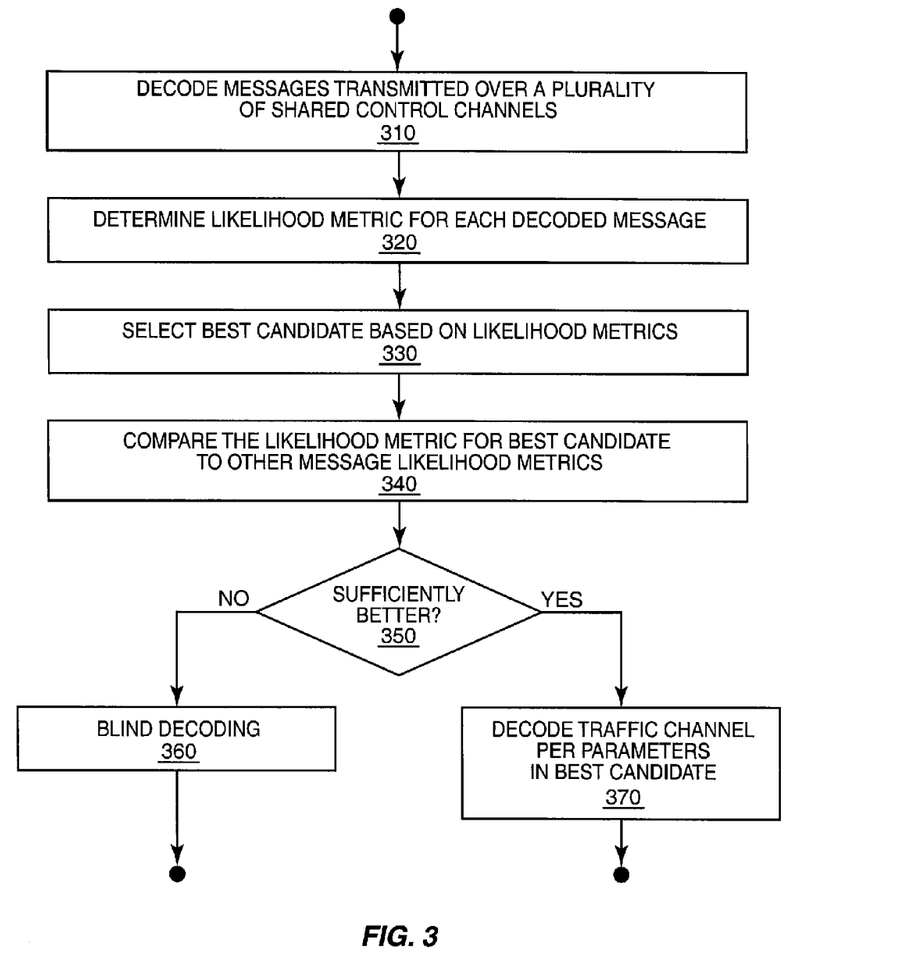
FIG. 3 is a logic flow diagram illustrating processing logic for one embodiment of a method for detecting a control channel.

FIG. 3 illustrates processing logic, as may be implemented with a wireless communication device that includes receiver 12, according to one or more such embodiments for control channel processing. While the illustrated processing is sequential, it should be understood that, where possible, one or more illustrated processing steps may be performed concurrently. Moreover, it should be understood that the illustrated processing may be performed on an on-going basis, and may be included in a larger set of ongoing receiver processing operations. Finally, although FIG. 3 is directed to the detection of HS-SCCH messages in a W-CDMA system, those skilled in the art will recognize that the techniques illustrated therein and described below may be applied to other systems and network topologies.

In any case, the illustrated processing "begins" with decoding the received symbols corresponding to a Part 1 message for each of two or more monitored High-Speed Shared Control Channel (HS-SCCH) codes, as illustrated at block 310. Those skilled in the art will appreciate that each monitored HS-SCCH code comprises a distinct control channel, wherein each channel is distinguished by its unique channelization code according to conventional CDMA methods. In HSDPA Release 6 systems, a mobile terminal (user equipment, or UE) can be assigned to monitor up to four HS-SCCH codes simultaneously, although more may be transmitted by transmitter 10 at any given time. Those skilled in the art will appreciate, however, that the methods and devices described herein may be adapted to systems in which more than four simultaneous HS-SCCHs are monitored.

In a typical embodiment, the Part 1 bit sequence for each of the monitored HS-SCCH codes is received using a RAKE receiver and decoded using a convolutional decoder. The Part 1 bit sequence may be masked using a UE-specific mask, thus requiring receiver 12 to unmask the bit sequence, using the UE-specific mask, prior to decoding. In any event, at least one decoded candidate message is generated for each of the monitored HS-SCCH codes. As will be discussed further, in some embodiments, one or more additional candidates may be generated, based on the convolutional decoder results, for each of the monitored HS-SCCH codes.

At block 320, at least one likelihood metric is determined for each of the candidate messages. In some embodiments, the likelihood metric comprises a decoder metric generated during the decoding of each message, such as a path metric from a Viterbi decoding process. As is well known to those skilled in the art, the Viterbi decoding algorithm computes a branch metric at each bit level in the decoding sequence; these branch metrics are summed for a particular bit sequence to determine a path metric. The highest path metric represents the most likely sequence of bits; the higher the path metric, the more likely that the corresponding sequence is the actual transmitted sequence of bits, and thus that the corresponding decoded message was the originally transmitted message.

In other embodiments, a likelihood metric may be determined for a candidate message by re-encoding the message according to the convolutional code, re-masking, using the UE-specific mask, and then correlating the resulting candidate bit sequence with the soft bit values originally obtained by the RAKE receiver. A higher correlation value indicates that a given candidate message more likely corresponds to the transmitted sequence.

At block 330, a best candidate is selected from the set of candidate messages, based on the likelihood metrics. Typically, such as with likelihood metrics comprising Viterbi decoder path metrics or the correlation values discussed above, the "best" candidate is simply the candidate message having the highest likelihood metric, although other likelihood metrics may be used where a lower metric value is superior.

At block 340, the likelihood metric for the best candidate is compared to the likelihood metrics for the other candidate messages to determine whether the best candidate is a valid message. In some embodiments, the likelihood metric for the best candidate is compared to an average of the likelihood metrics for the other candidate messages. In several embodiments, the best candidate likelihood metric is tested to determine whether it is sufficiently greater than the average of the other likelihood metrics. In other words, the best candidate likelihood metric is compared to the average of the likelihood values for the other messages multiplied by a scaling constant. In these embodiments, if the likelihood metric for message i is given by $\lambda_1$, then a best candidate message is valid if $$\lambda_{best} > \tau \cdot \underset{i \neq best}{mean}[\lambda_i].$$

Expressed alternatively, the best candidate message is valid if $$\frac{\lambda_{best}}{\underset{i \neq best}{mean}[\lambda_i]} > \tau.$$

In other embodiments, a power measure may be used. For example, a best candidate may be deemed valid if $$\frac{|\lambda_{best}|^2}{\left|\underset{i \neq best}{var}[|\lambda_i|]\right|} \geq \tau.$$

Of course, the appropriate value for the scaling constant $\tau$ depends on the type of likelihood metric, and whether a magnitude, power, or other representation is used. The value of $\tau$ may also be tuned to yield a particular false-alarm or missed-detection probability for a given design under certain conditions.

Referring again to FIG. 3, a determination that the best candidate message is a valid message is made at block 350, by testing whether the likelihood metric for the best candidate is sufficiently better than the likelihood metrics for the other candidate messages. This test may comprise one of the comparisons discussed above, or any of a variety of alternatives. In some embodiments, for instance, the best candidate message may be tested by determining whether it exceeds the mean of the other candidate message likelihood metrics by a sufficient absolute margin. In other embodiments, the best candidate message may be tested by determining whether it exceeds the highest likelihood metric of the other candidates (i.e., the second best candidate) by a sufficient margin. This required margin may be absolute, or relative, i.e., the test may be whether $\lambda_{best} > \lambda_{2nd\_best} + a$ or whether $\lambda_{best} > b \cdot \lambda_{2nd\_best}$. Power measures, e.g. squared likelihood metrics, may also be used in some of these alternative tests. In some embodiments, more than one test may be used. For example, the likelihood metric for the best candidate may be tested to determine whether it exceeds a scaled mean of the other likelihood metrics and exceeds the $2^{nd}$-highest likelihood metric by a certain margin.

A determination that a candidate message is a "valid" message represents a decision that a message was actually intended for the receiver 12. As a result of this determination, control processing circuits 40 typically configure receiver 12 to receive the appropriate traffic channel data, e.g., a subframe on the HS-PDSCH indicated by the valid control channel message, using the demodulation parameters indicated by the message. This is shown at block 370 of FIG. 3. Detection of a valid Part 1 message in an HSDPA system also triggers the receiving and decoding of the corresponding Part 2 data, which may be used, inter alia, to verify the validity of the best candidate message by means of a CRC (cyclic redundancy check) field. On the other hand, if the message is deemed not valid, then blind decoding of one or more HS-PDSCH code channels is undertaken in a Release 7 HSDPA system, as shown at block 360.

Those skilled in the art will thus appreciate that a determination that a best candidate message is valid is necessarily a tentative determination, as there remains a finite probability that one of the other candidate messages is actually the intended message, or that no control channel message at all was targeted to receiver 12 for the time interval of interest. Nevertheless, the methods described above and elaborated upon below provide an approach for finding the most likely message candidate, as well as for improving the reliability of the message detection decision. The decision process may be fine-tuned, as discussed above, to achieve a desired false-alarm rate or missed-detection rate. Furthermore, the low-complexity techniques described herein allow the mobile terminal hardware to be designed more efficiently, saving chip area, cost, and/or reducing receiver power consumption.

In some embodiments, the reliability of valid message detection may be further improved by extending the candidate message pool to obtain additional statistics for the comparison process. The decoded candidate messages (typically up to four) constitute a set T of a few primary candidates out of the $2^8$ (Type 1 or 2) or $2^{12}$ (Type M) possible messages. The set of possible messages, i.e., the hypothesis set, may be denoted by Q. The set of primary candidates T is then extended with a set U of additional candidates, to obtain additional statistics. Typically, $|U|>>|T|$; while $|U|<<|Q|$.

In some of these embodiments, the additional candidates are generated randomly from the $2^8$ (Type 1 or 2) or $2^{12}$ (Type M) possible messages. In other embodiments, a more "intelligent" approach to generating additional candidates may be used. For instance, one or more additional candidate messages may be selected from frequently used messages—perhaps the five most frequently used message sequences may be used as additional cases. Those skilled in the art will appreciate that in some cases the "best" candidate, indeed, the correct message, may sometimes be one of these additionally generated messages, particularly if a reduced-complexity decoding approach is used to produce the decoded message candidates.

In several embodiments, the 40-bit coded (and masked, if necessary) bit sequences corresponding to each entry in the total candidate set V=T∪U are generated and correlated with the received data. This is similar to the maximum-likelihood process discussed above, but substantially fewer candidates than the entire hypothesis set are used. If the correlation values for each candidate i are denoted by $c_i$, then candidate $i_{max}$, having the largest correlation magnitude, is chosen as the "winning", or best, candidate. The best candidate's correlation value $c_{i_{max}}$ is subsequently compared to a noise floor formed by the other candidates' correlation values to determine whether candidate $i_{max}$ is a valid message. In some embodiments, this determination is based on whether $$\frac{c_{i_{max}}}{\underset{i \neq i_{max}}{mean[|c|]}} \geq \tau.$$

As was discussed above, other forms of relative magnitude or power measures may be used instead. For instance a test based on power measures may be based on whether $$\frac{|c_{i_{max}}|^2}{\underset{i \neq i_{max}}{var\ [|c_i|]}} \geq \tau.$$

Again, the threshold may be determined based on the specific receiver design and the target false-alarm and missed-detection probabilities. In embodiments using extended candidate message sets, however, the statistics of the comparison process are generally improved, allowing finer tuning of the false-alarm and missed-detection statistics. Using this approach in a HSDPA system that supports MIMO operation, the best candidate and reliable information as to whether the best candidate corresponds to a received Part 1 message may be determined while avoiding full maximum-likelihood detection complexity for the 12-bit Part 1 field.

In some of these embodiments, a reduced-complexity Viterbi decoder that produces one or more primary candidates for each of the monitored shared control channels may be used. Because the best candidate is determined using the subsequent maximum-likelihood correlation process, as described above, the requirements on the Viterbi decoder may be relaxed. As a result, the complexity of the Viterbi decoder may be reduced, e.g., a pruned trellis may be used, when finding the primary candidates, thus saving power and decoder resources. In embodiments where a Viterbi decoder with reduced trellis is used, additional candidate messages may be produced by perturbing the winning candidate information bit sequence to possibly recover any lost paths in the trellis. Using this approach, for instance, one or more next-most-likely decoding results may be produced for each of the monitored control channels.

Figure 4:
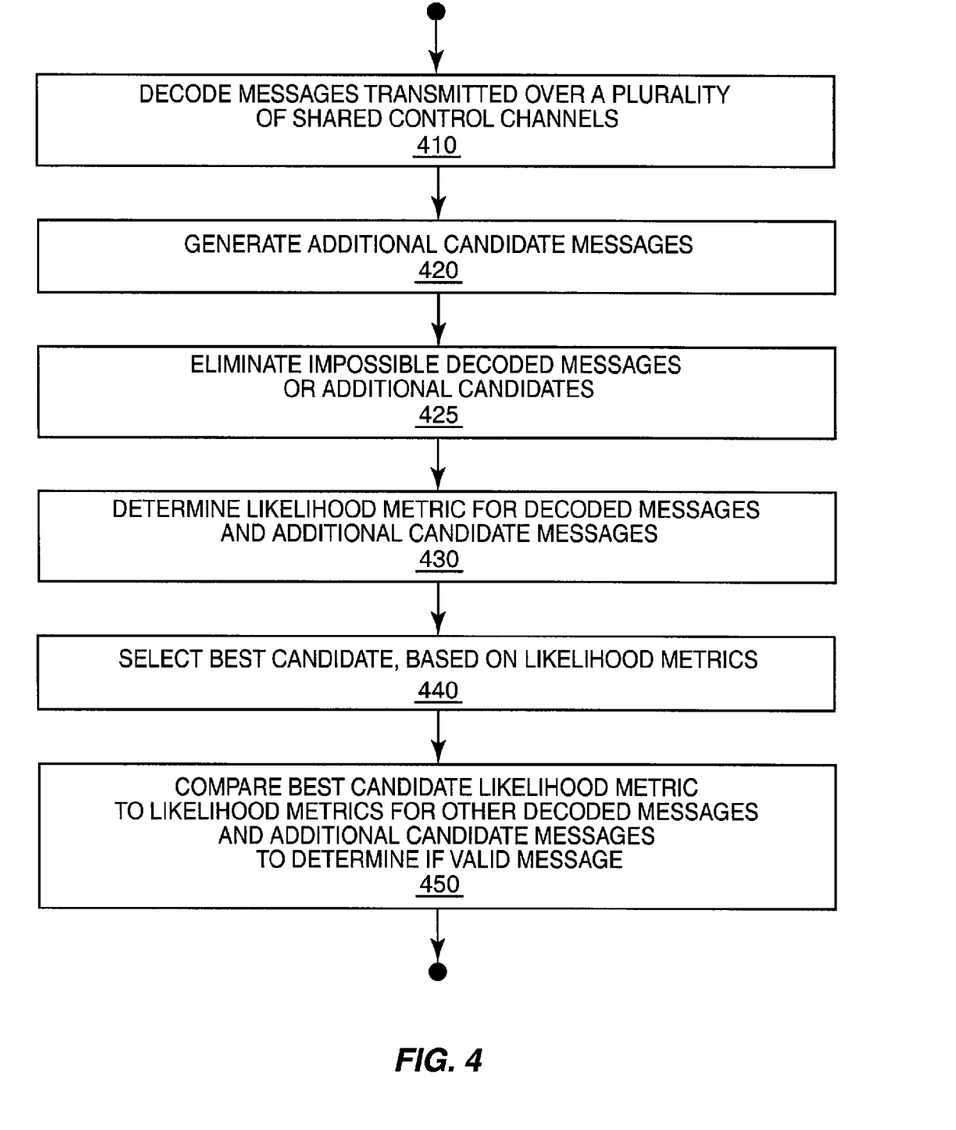
FIG. 4 is a flow diagram illustrating another exemplary method for detecting a control channel.

An exemplary method for detecting a control channel message transmitted on one of one or more shared control channels, using an extended candidate pool, is illustrated in FIG. 4. At block 410, candidate messages are decoded from one or more shared control channels. As previously discussed, a receiver 12 may be directed to monitor up to four HS-SCCH code channels in an HSDPA system. In some embodiments, a single candidate message may be decoded for each code, using a Viterbi decoder. In some of these embodiments, the Viterbi decoder may comprise a reduced-complexity Viterbi decoder, such as a Viterbi decoder using a pruned trellis.

At block 420, additional candidate messages are generated. A larger candidate pool generally produces more predictable statistics, allowing finer control of message detection performance. In one or more embodiments, additional candidate messages are randomly selected from the set of possible messages. In some of these embodiments, additional candidate messages are randomly selected and encoded using a convolutional code for subsequent processing, while in others, pre-encoded bit sequences corresponding to possible decoded messages may be selected. In other embodiments, one or more additional candidate messages may be selected from frequently used messages; in these embodiments, it may be particularly convenient to store the encoded sequence corresponding to the frequently used messages to reduce processing time during the message detection process. In still other embodiments, additional candidate messages may be produced by the decoding processes that generated the original candidate messages. For example, Viterbi decoder branch metrics may be analyzed to determine potential alternate sequences. Those skilled in the art will be familiar with techniques for perturbing a decoded sequence in a reduced-trellis Viterbi decoder to recover alternative bit sequences corresponding to additional candidate messages.

The message detection process may be further improved in some embodiments by eliminating "impossible" candidates from the pool of candidate message sequences, as shown at block 425. In many cases, such as with HS-SCCH, some of the possible messages may be undefined, and will never be transmitted. For example, an HS-SCCH Part 1 message may include a 7-bit channelization code set parameter. Since less than all of the possible 128 code sets may be supported by a receiving mobile terminal, several of the 7-bit code set parameter sequences will never occur. Similarly, only five modulation combinations are defined for HS-SCCH signaling; thus three of the possible eight 3-bit modulation set parameters will never occur. These and other "impossible" sequences may be eliminated from the pool of candidate messages before the candidates are tested, thus reducing processing time and improving the detection statistics. Those skilled in the art will appreciate that the impossible message sequences may be detected by simply scanning the candidates for un-allowed sequences. Once detected, each "impossible" candidate may simply be eliminated from the pool used for finding the best candidate and/or for testing the quality of the best candidate. Those skilled in the art will further appreciate that these impossible message sequences may be detected using the 8- or 12-bit candidate messages or using encoded sequences corresponding to those impossible message sequences.

At block 430, a likelihood metric is determined for each of the decoded messages as well as for each of the additional candidate messages. As discussed above, in several embodiments the likelihood metrics are determined by re-encoding candidate messages and correlating the re-encoded bit sequences with the corresponding soft bit values to yield a correlation value that may be used as a likelihood metric. (As discussed above, in some embodiments, some of the additional candidate messages may already be stored in encoded form, thus making the re-encoding step unnecessary.) In others, Viterbi decoder metrics may be used as likelihood metrics.

At block 440, a best candidate is selected, based on likelihood metrics. In some embodiments, the best candidate is selected from only the originally decoded messages, not from among the total pool of candidate messages (decoded messages plus additional candidate messages). In others, the best candidate may be selected from all of the candidate messages. In practice, the results will often be the same, regardless of which approach is taken. However, in some embodiments, for example in embodiments where a likelihood metric other than a decoder metric is used, it is possible that an additional candidate message selected because its path metric was close to that of one of the decoded messages might yield a "better" likelihood value.

In any event, at block 450, a likelihood metric for the best candidate is compared to likelihood metrics for other decoded messages as well as to the likelihood metrics for the additional candidate messages, to determine whether the best candidate is a valid message. Note that this comparison need not be in two steps, although in some embodiments it might be. The comparison process may be according to any of the previously-described approaches, or variants thereof. Those skilled in the art will recognize that the extended candidate pool will generally result in less volatility in the candidate statistics. In many implementations this will enable more precise control of the desired performance, whether with respect to false-alarm rate or missed-detection rate.

In some embodiments, the comparison process illustrated at block 450 may employ a scaling constant, such that the likelihood metric for the best candidate must exceed the average of the other likelihood metrics multiplied by the scaling constant. In several of these embodiments, the scaling constant may be selected from two or more possible scaling constants based on whether the receiver is configured for HS-SCCH-less operation. More generally, the scaling constant may be selected based on whether the receiver is configured to receive unannounced transmissions on one or more traffic channels corresponding to the shared control channels. In these or other embodiments, selection of the scaling factor may be based on whether the receiving mobile terminal is configured for MIMO operation. Thus, the false-alarm and/or missed-detection performance of the receiver may be tuned for various modes of operation.

Those skilled in the art will also appreciate that the likelihood metric used at block 450 to determine whether a best candidate is sufficiently more likely than other candidates to be deemed a valid message need not be the same likelihood metric used to select the best candidate. For example, consider an embodiment where likelihood metrics for the decoded messages and the other candidate messages are generated by re-encoding and correlating with the received soft bit value sequence. In these embodiments, the resulting correlation values are used in the comparison process of block 450 to determine whether the best candidate should be deemed valid. In these embodiments, the best candidate may also be selected using these same likelihood values. Typically, the candidate corresponding to the highest correlation value is selected as the best candidate. However, the best candidate may be selected in some embodiments on the basis of the decoder metrics. For instance, the decoded message (in HSDPA systems, from among the up to four decoded messages) having the highest path metric may be deemed the best candidate. In some of these embodiments, additional candidate messages may be randomly selected from among the possible messages; these randomly-selected messages will not have corresponding decoder metrics. Thus, the decoder metrics may be used to select the best candidate, while maximum-likelihood correlation values are used to determine whether the best candidate is valid.

Any of the methods described above, as well as variations and extensions of them, may be implemented with a wireless communication device such as receiver 12 illustrated in FIGS. 1 and 2. Thus, in one or more embodiments, a receiver 12 is configured to detect messages transmitted over a plurality of shared control channels, determine at least one likelihood metric for each of the decoded messages, select a best candidate from the decoded messages, based on the likelihood metrics, and compare the at least one likelihood metric for the best candidate to the corresponding likelihood metrics for the messages other than the best candidate to determine whether the best candidate is a valid message. As noted above, the likelihood metric used to compare the best candidate to the others may not be the same likelihood metric used to select the best candidate from among the decoded messages.

In some embodiments, receiver 12 is further configured to generate one or more additional candidate messages and calculate additional likelihood metrics corresponding to the additional candidate messages. In these embodiments, the at least one likelihood metric for the best candidate is compared to corresponding likelihood metrics for the messages other than the best candidate and to the additional likelihood metrics.

In some embodiments, the likelihood metrics used to determine whether a selected best candidate is a valid message are formed by re-encoding the decoded messages, as well as any additional candidate messages, and correlating each of the re-encoded bit sequences with a received sequence of soft bit values. In several of these embodiments, receiver 12 is configured to determine that a best candidate message is valid by testing whether the likelihood metric for the best candidate message exceeds a scaled average of the likelihood metrics for the other candidates, e.g. whether $$\frac{c_{i_{max}}}{\underset{i \neq i_{max}}{mean}[[c_i]]} \geq \tau.$$

With these and other variations and extensions in mind, those skilled in the art will appreciate that the foregoing description and the accompanying drawings represent non-limiting examples of the methods and devices taught herein for detecting a valid control channel message, whether the methods and/or devices are employed in a W-CDMA HSDPA system or another wireless communication system. As such, the inventive apparatus and techniques taught herein are not limited by the foregoing description and accompanying drawings. Instead, the present invention is limited only by the following claims and their legal equivalents.

What is claimed is:

1. A method for detecting a control channel message in a communication receiver, the method comprising:
   decoding messages transmitted over a plurality of shared control channels;
   determining at least one likelihood metric for each of the decoded messages;
   selecting a best candidate from the decoded messages, based on the likelihood metrics;
   generating one or more additional candidate messages in addition to the decoded messages;
   calculating additional likelihood metrics corresponding to the additional candidate messages; and
   comparing the at least one likelihood metric for the best candidate to the corresponding likelihood metrics for the decoded messages other than the best candidate and to the additional likelihood metrics to determine whether the best candidate is a valid message;
   wherein the at least one likelihood metric for each of the decoded messages includes a decoder metric and a correlation value obtained by re-encoding the decoded message to obtain a re-encoded bit sequence and correlating the re-encoded bit sequence with a received sequence of soft values corresponding to the decoded message;
   wherein calculating the additional likelihood metrics corresponding to the additional candidate messages comprises encoding the additional candidate messages and correlating the encoded the additional candidate messages with the received sequence of soft values to obtain the additional likelihood metrics;
   wherein selecting the best candidate from the decoded messages comprises selecting the message corresponding to a best decoder metric;
   wherein comparing the at least one likelihood metric for the best candidate to the corresponding likelihood metrics for the messages other than the best candidate and to the additional likelihood metrics to determine whether the best candidate is a valid message comprises comparing the correlation value for the best candidate to correlation values for the messages other than the best candidate and to the additional likelihood metrics.

2. The method of claim 1, wherein generating one or more additional candidate messages comprises randomly selecting the one or more additional candidate messages from a set of possible messages.

3. The method of claim 1, wherein determining at least one likelihood metric for each of the decoded messages comprises re-encoding the decoded message to obtain a re-encoded bit sequence and correlating the re-encoded bit sequence with a received sequence of soft values corresponding to the decoded message to obtain the correlation value for use as the at least one likelihood metric.

4. The method of claim 1, wherein generating one or more additional candidate messages comprises selecting one or more frequently used messages for use as additional candidate messages.

5. The method of claim 1, wherein generating one or more additional candidate messages comprises determining one or more next-most-likely decoding results corresponding to one or more of the decoded messages.

6. The method of claim 5, wherein determining one or more next-most-likely decoding results comprises perturbing an information bit sequence corresponding to one of the decoded messages to recover potential lost paths in a reduced-trellis Viterbi decoder.

7. The method of claim 1, further comprising eliminating decoded messages or additional candidate messages having impossible information bit sequences before comparing the likelihood metric for the best candidate to the likelihood metrics for the decoded messages other than the best candidate and to the additional likelihood metrics.

8. The method of claim 1, wherein comparing the correlation value for the best candidate to correlation values for the messages other than the best candidate and to the additional likelihood metrics comprises comparing the correlation value for the best candidate to an average of the correlation values for the messages other than the best candidate and the additional likelihood metrics, multiplied by a scaling constant.

9. The method of claim 8, further comprising selecting the scaling constant based on whether a receiving mobile terminal is configured to receive unannounced transmissions on one or more traffic channels corresponding to the shared control channels.

10. The method of claim 8, further comprising selecting the scaling constant based on whether a receiving mobile terminal is configured for multiple-input-multiple-output (MIMO) operation.

11. The method of claim 1, further comprising selectively (a) decoding a traffic channel using decoding parameters determined from the best candidate or (b) blind decoding one or more traffic channels using one or more pre-determined decoding parameters, based on whether the best candidate is a valid message.

12. The method of claim 11, wherein the plurality of shared control channels comprise High-Speed Shared Control Channels (HS-SCCHs) in a Wideband Code-Division Multiple Access (W-CDMA) system, the traffic channel comprises a High-Speed Physical Downlink Shared Channel (HS-PDSCH), and the messages comprise Part 1 messages of the HS-SCCHs.

13. A wireless communications receiver comprising one or more processing circuits configured to:

decode messages transmitted over a plurality of shared control channels;

determine at least one likelihood metric for each of the decoded messages;

select a best candidate from the decoded messages, based on the likelihood metrics;

generate one or more additional candidate messages in addition to the decoded messages;

calculate additional likelihood metrics corresponding to the additional candidate messages; and compare the at least one likelihood metric for the best candidate to the corresponding likelihood metrics for the messages other than the best candidate and to the additional likelihood metrics to determine whether the best candidate is a valid message;

wherein the at least one likelihood metric for each of the decoded messages includes a decoder metric and a correlation value obtained by re-encoding the decoded message to obtain a re-encoded bit sequence and correlating the re-encoded bit sequence with a received sequence of soft values corresponding to the decoded message;

wherein the one or ore processing circuits are configured to calculate the additional likelihood metrics corresponding to the additional candidate messages by encoding the additional candidate messages and correlating the encoded additional candidate messages with the received sequence of soft values to obtain the additional likelihood metrics;

wherein the one or more processing circuits are configured to select the best candidate from the decoded messages by selecting the message corresponding to a best decoder metric; and wherein the one or more processing circuits are configured to compare the at least one likelihood metric for the best candidate to the corresponding likelihood metrics for the messages other than the best candidate and to the additional likelihood metrics to determine whether the best candidate is a valid message by comparing the correlation value for the best candidate to correlation values for the messages other than the best candidate and to the additional likelihood metrics.

14. The wireless communication receiver of claim 13, wherein the one or more processing circuits are configured to generate one or more additional candidate messages by randomly selecting the one or more additional candidate messages from a set of possible messages.

15. The wireless communication receiver of claim 13, wherein the one or more processing circuits are configured to determine at least one likelihood metric for each of the decoded messages by re-encoding the decoded message to obtain a re-encoded bit sequence and correlating the re-encoded bit sequence with a received sequence of soft values corresponding to the decoded message to obtain the correlation value for use as the at least one likelihood metric.

16. The wireless communication receiver of claim 13, wherein the one or more processing circuits are configured to generate one or more additional candidate messages by perturbing an information bit sequence corresponding to one of the decoded messages to recover potential lost paths in a reduced-trellis Viterbi decoder.

17. The wireless communication receiver of claim 13, wherein the one or more processing circuits are further configured to eliminate decoded messages or additional candidate messages having impossible information bit sequences before comparing the likelihood metric for the best candidate to the likelihood metrics for the decoded messages other than the best candidate and to the additional likelihood metrics.

18. The wireless communication receiver of claim 13, wherein the one or more processing circuits are further configured to selectively (a) decode a traffic channel using decoding parameters determined from the best candidate or (b) blindly decode one or more traffic channels using one or more pre-determined decoding parameters, based on whether the best candidate is a valid message.

\* \* \* \* \*